United States Patent
Chou et al.

(10) Patent No.: US 8,110,433 B2
(45) Date of Patent: Feb. 7, 2012

(54) METHOD OF FABRICATING AN ORGANIC THIN FILM TRANSISTOR AND METHOD OF SURFACE TREATMENT FOR GATE INSULATING LAYER

(75) Inventors: Cheng Wei Chou, Houbi Township, Tainan County (TW); Hsiao Wen Zan, Zhudong Township, Hsinchu County (TW); Jenn-Chang Hwang, Hsinchu (TW); Chung Hwa Wang, Huatan Township, Changhua County (TW); Li Shiuan Tsai, Kaohsiung (TW); Wen Chieh Wang, Kaohsiung (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 12/656,331

(22) Filed: Jan. 26, 2010

(65) Prior Publication Data
US 2011/0086467 A1   Apr. 14, 2011

(30) Foreign Application Priority Data
Oct. 8, 2009 (TW) ................................ 98134109 A

(51) Int. Cl.
*H01L 21/40* (2006.01)
(52) U.S. Cl. .................... 438/99; 438/758; 257/E51.006
(58) Field of Classification Search .............. 438/99, 438/758; 257/E51.006
See application file for complete search history.

(56) References Cited

U.S. PATENT DOCUMENTS

| 2006/0068519 A1* | 3/2006 | Dunbar et al. ............... 438/82 |
| 2007/0134857 A1* | 6/2007 | Suh et al. .................. 438/149 |
| 2007/0152210 A1* | 7/2007 | Han et al. .................... 257/40 |
| 2007/0155067 A1* | 7/2007 | Park et al. ................. 438/149 |
| 2008/0048181 A1* | 2/2008 | Tanaka et al. ................ 257/40 |

* cited by examiner

*Primary Examiner* — Alexander Ghyka
*Assistant Examiner* — Stanetta Isaac
(74) *Attorney, Agent, or Firm* — Bacon & Thomas, PLLC

(57) ABSTRACT

A method of fabricating an organic thin film transistor is disclosed, which comprises steps of (S1) forming a gate electrode on a substrate; (S2) forming a gate insulating layer on the gate electrode; (S3) providing a gas on the surface of the gate insulating layer to form hydrophobic molecules on the surface of the gate insulating layer; (S4) forming an organic semiconductor layer, a source electrode, and a drain electrode over the gate insulating layer having hydrophobic molecules thereon, wherein the gas of step (S3) is at least one selected from the group consisting of halogen-substituted hydrocarbon, un-substituted hydrocarbon, and the mixtures thereof. The method of the present invention utilizes gases comprising carbon or fluorine atom to perform surface treatment on the surface of the gate insulating layer, therefore the hydrophobic character of the surface of the gate insulating layer can be enhanced and the electrical properties of the OTFT can be improved. Also, a method of surface treatment for the gate insulating layer is disclosed.

19 Claims, 3 Drawing Sheets

METHOD OF FABRICATING AN ORGANIC THIN FILM TRANSISTOR AND METHOD OF SURFACE TREATMENT FOR GATE INSULATING LAYER

BACKGROUND OF THE INVENTION

1. Field of the Invention

The present invention relates to a method of fabricating an organic thin film transistor and a method of surface treatment for a gate insulating layer of an organic thin film transistor.

2. Description of Related Art

Organic thin film transistors (OTFTs) are currently the focus of considerable research due to their low fabricating cost, rollability, and large display area. OTFTs can be divided into top contact OTFTs and bottom OTFTs according to their structure. A top contact OTFT is generally composed of a substrate 10; a gate electrode 11 formed on the substrate 10; a gate insulating layer 12 formed on the gate electrode 11, an organic semiconductor layer 13 formed on and covering the whole gate insulating layer 12, and a source electrode 14 and a drain electrode 15 formed on the organic semiconductor layer 13, as shown in FIG. 1.

Referring to FIG. 2, in which a bottom contact OTFT is shown, a conventional bottom contact OTFT is generally composed of a substrate 10; a gate electrode 11 formed on the substrate 10; a gate insulating layer 12 formed on the gate electrode 11; a source electrode 14 and a drain electrode 15 formed on the gate insulating layer 12; and an organic semiconductor layer 13 formed on and covering the source electrode 14, the drain electrode 15, and the gate insulating layer 12.

In the fabrication of an OTFT, if an organic semiconductor layer is formed on a gate insulating layer with high hydrophobicity (i.e. low surface energy), a better electric characteristic of the organic semiconductor layer can be obtained. In a conventional method, a surface treatment is applied to improve the hydrophobicity of the surface of the gate insulating layer, which forms a self-assembled monolayer (SAM) on the gate insulating layer to transform the hydrophlic surface property into hydrophobic surface property of the gate insulating layer, in which octadecyltrimethoxysilane (ODMS), octadecyltrichlorosilane (OTS), etc. may be used as the material of the self-assembled monolayer. In another surface treatment method, plasma is utilized to increase the hydrophobicity of the surface of the gate insulating layer and improve the electric characteristic of the organic semiconductor layer.

However, the self-assembled monolayer (SAM) is usually made of materials with low dielectric constant, therefore when the SAM is applied to the surface treatment of the gate insulating layer, the capacity of the gate insulating layer may decrease, the operating voltage of the device may be raised, and the workload of the low-energy-consumption devices may also be increased. Alternatively, if plasma is used for the surface hydrophobic treatment of the gate insulating layer, the bombarding of the plasma may cause damage of the surface of the gate insulating layer and destroy the dielectric characteristic of the gate insulating layer. In a plasma surface treatment process, the material of the substrate should be specially limited (for example, a plastic flexible substrate may not be used) due to the applied high temperature (about 300° C. or above). Hence, the plasma-based surface treatment process is not suitable to be applied to flexible OTFT surface treatment. Besides, economical efficiency may decrease because expensive plasma equipment for OTFT surface treatment is required.

Therefore, it is desirable to provide an improved surface treatment method (or a method for increasing the hydrophobicity) for the surface of the gate insulating layer, which can be applied under low temperature conditions and also has advantages of low manufacturing cost and simple processing steps, and enables high hydrophobicity and lowers the surface energy of the gate insulating layer, and can improve the electric characteristic of the organic semiconductor layer without destroying the surface and decreasing the capacity of the gate insulating layer.

SUMMARY OF THE INVENTION

The present invention provides a method of fabricating an organic thin film transistor, which comprises steps of: (S1) forming a gate electrode on a substrate; (S2) forming a gate insulating layer on the gate electrode; (S3) providing a gas on the surface of the gate insulating layer to form hydrophobic molecules on the surface of the gate insulating layer; and (S4) forming an organic semiconductor layer, a source electrode, and a drain electrode over the gate insulating layer having hydrophobic molecules thereon, wherein the gas of step (S3) is at least one selected from the group consisting of halogen-substituted hydrocarbon, un-substituted hydrocarbon, and the mixture thereof.

According to the method of fabricating an organic thin film transistor of the present invention, a gas having carbon (e.g. un-substituted hydrocarbon gases such as methane, acetylene, or propyne) or a gas having fluorine (e.g. halogen-substituted hydrocarbon gases such as tetrafluoromethane) is provided for surface treatment of the gate insulating layer under a low temperature condition, in which hydrophobic molecules are formed on the surface of the gate insulating layer, therefore the hydrophobicity of the surface of the gate insulating layer can be increased, the surface energy can be decreased which is constructive for the deposition of the organic semiconductor layer forming on the gate insulating layer, and the electrical properties of the OTFT can be improved. Since the method of fabricating an organic thin film transistor of the present invention can be operated in a low temperature condition, a plastic flexible substrate can be used without any special limitation, which means the method of the present invention can be applied to the fabrication of flexible OTFTs. Hence, the method of fabricating an OTFT of the present invention is much more applicable compared with that in the prior art. Moreover, according to the method of fabricating an organic thin film transistor of the present invention, expensive equipment such as plasma machines is not needed and therefore the manufacturing cost is favorably reduced and the economical efficiency is increased.

According to the method of fabricating an organic thin film transistor of the present invention, a flow rate of the gas in the step (S3) is preferably 10 to 1000 sccm, more preferably 100 sccm; a pressure of the gas in the step (S3) is preferably $1 \times 10^{-2}$ to 1 ton, more preferably $7 \times 10^{-1}$ torr. The reaction rate between the gas molecules and the gate insulating layer can be controlled by adjusting the flow rate and the pressure of the provided gas.

According to the method of fabricating an organic thin film transistor of the present invention, the duration of the provided gas in the step (S3) is preferably 15 minutes or above.

According to the method of fabricating an organic thin film transistor of the present invention, in the step (S4), the organic semiconductor layer may preferably cover the whole gate insulating layer having hydrophobic molecules thereon, and the source electrode and the drain electrode may preferably form on the organic semiconductor layer to achieve a top contact OTFT.

Alternatively, according to the method of fabricating an organic thin film transistor of the present invention, in the step (S4), the source electrode and the drain electrode may preferably be formed on the gate insulating layer having hydrophobic molecules thereon, and the organic semiconductor layer may preferably be formed covering the source electrode, the drain electrode, and the gate insulating layer to achieve a bottom contact OTFT.

According to the method of fabricating an organic thin film transistor of the present invention, the gate insulating layer is preferably made of aluminum nitride (AlN) to increase the hydrophobicity of the surface of the gate insulating layer.

According to the method of fabricating an organic thin film transistor of the present invention, the halogen may preferably be fluorine.

According to the method of fabricating an organic thin film transistor of the present invention, the un-substituted hydrocarbon may be preferably at least one selected from the group consisting of: alkane having 1 to 8 of carbon atoms, alkene having 2 to 4 of carbon atoms, alkyne having 2 to 3 of carbon atoms, and the mixtures thereof; more preferably methane, acetylene, or propyne.

According to the method of fabricating an organic thin film transistor of the present invention, the halogen-substituted hydrocarbon may be preferably at least one selected from the group consisting of: halogen-substituted alkane having 1 to 8 of carbon atoms, halogen-substituted alkene having 2 to 4 of carbon atoms, halogen-substituted alkyne having 2 to 3 of carbon atoms, and the mixtures thereof; more preferably tetrafluoromethane.

According to the method of fabricating an organic thin film transistor of the present invention, the materials of the gate electrode, the source electrode, and the drain electrode are not specially limited, the materials used in the prior art for these electrodes can be used here, preferably the gate electrode, the source electrode, and the drain electrode of the present invention are independently made of at least one selected from the group consisting of: Cu, Cr, Mn, Fe, Co, Ni, Zn, Pd, Ag, Pt, Au, Al, and the alloy thereof.

According to the method of fabricating an organic thin film transistor of the present invention, the material of the organic semiconductor layer is not specially limited, the material such as pentacene, fullerene, Poly(3-hexylthiophene) (P3HT), Phenyl-C61-Butyric-Acid-Methyl-Ester (PCBM), and the mixtures thereof used in the prior art for the organic semiconductor layer can be used here.

The present invention also provides a method of surface treatment for a gate insulating layer of an organic thin film transistor, which comprises: providing a gas on a surface of a gate insulating layer of an organic thin film transistor to form hydrophobic molecules on the surface of the gate insulating layer; wherein the gas is at least one selected from the group consisting of halogen-substituted hydrocarbon, un-substituted hydrocarbon, and the mixture thereof.

According to the method of surface treatment for a gate insulating layer of an organic thin film transistor of the present invention, a gas having carbon (e.g. un-substituted hydrocarbon gases such as methane, acetylene, or propyne) or a gas having fluorine (e.g. halogen-substituted hydrocarbon gases such as tetrafluoromethane) is provided for surface treatment of the gate insulating layer under a low temperature condition, in which hydrophobic molecules are formed on the surface of the gate insulating layer, therefore the hydrophobicity of the surface of the gate insulating layer can be increased, the surface energy can be decreased which is constructive for the deposition of the organic semiconductor layer forming on the gate insulating layer, and the electrical properties of the OTFT can be improved.

Compared with the conventional method such as a self-assembled monolayer (SAM) method or a plasma method, the method of the present invention has advantages of simple processing steps without destroying the surface and decreasing the capacity of the gate insulating layer. Besides, since the method of surface treatment for a gate insulating layer of an organic thin film transistor of the present invention can be operated in a low temperature condition, a plastic flexible substrate can be used without any special limitation, which means the method of the present invention can be applied to the fabrication of flexible OTFTs. Hence, the method of surface treatment for a gate insulating layer of an OTFT of the present invention is much more applicable compared with that such as plasma method in the prior art. Moreover, according to the method of surface treatment for a gate insulating layer of an OTFT of the present invention, expensive equipment such as plasma machines is not needed and therefore the manufacturing cost is favorably reduced and the economical efficiency is increased.

According to the method of surface treatment for a gate insulating layer of an OTFT of the present invention, a flow rate of the gas is preferably 10 to 1000 sccm, more preferably 100 sccm; a pressure of the gas is preferably $1 \times 10^{-2}$ to 1 torr, more preferably $7 \times 10^{-1}$ ton. The reaction rate between the gas molecules and the gate insulating layer can be controlled by adjusting the flow rate and the pressure of the provided gas.

According to the method of surface treatment for a gate insulating layer of an OTFT of the present invention, the duration of the provided gas is preferably 15 minutes or above.

According to the method of surface treatment for a gate insulating layer of an OTFT of the present invention, the gate insulating layer is preferably made of aluminum nitride (AlN) to increase the hydrophobicity of the surface of the gate insulating layer.

According to the method of surface treatment for a gate insulating layer of an OTFT of the present invention, the halogen may preferably be fluorine.

According to the method of surface treatment for a gate insulating layer of an OTFT of the present invention, the un-substituted hydrocarbon may be preferably at least one selected from the group consisting of: alkane having 1 to 8 of carbon atoms, alkene having 2 to 4 of carbon atoms, alkyne having 2 to 3 of carbon atoms, and the mixtures thereof; more preferably methane, acetylene, or propyne.

According to the method of surface treatment for a gate insulating layer of an OTFT of the present invention, the halogen-substituted hydrocarbon may be preferably at least one selected from the group consisting of: halogen-substituted alkane having 1 to 8 of carbon atoms, halogen-substituted alkene having 2 to 4 of carbon atoms, halogen-substituted alkyne having 2 to 3 of carbon atoms, and the mixtures thereof; more preferably tetrafluoromethane.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Example 1

Figure 1:
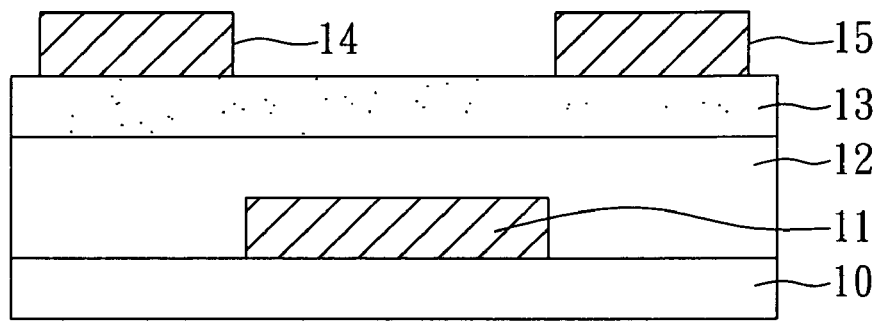
FIG. 1 is a schematic view of a conventional top contact OTFT.
Figure 2:
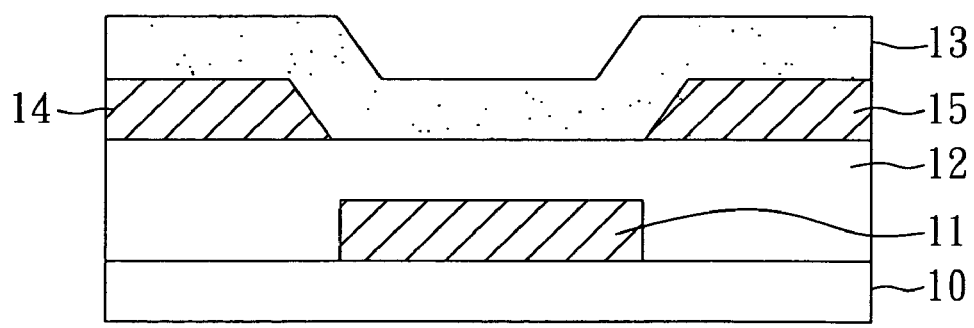
FIG. 2 is a schematic view of a conventional bottom contact OTFT.
Figure 3:
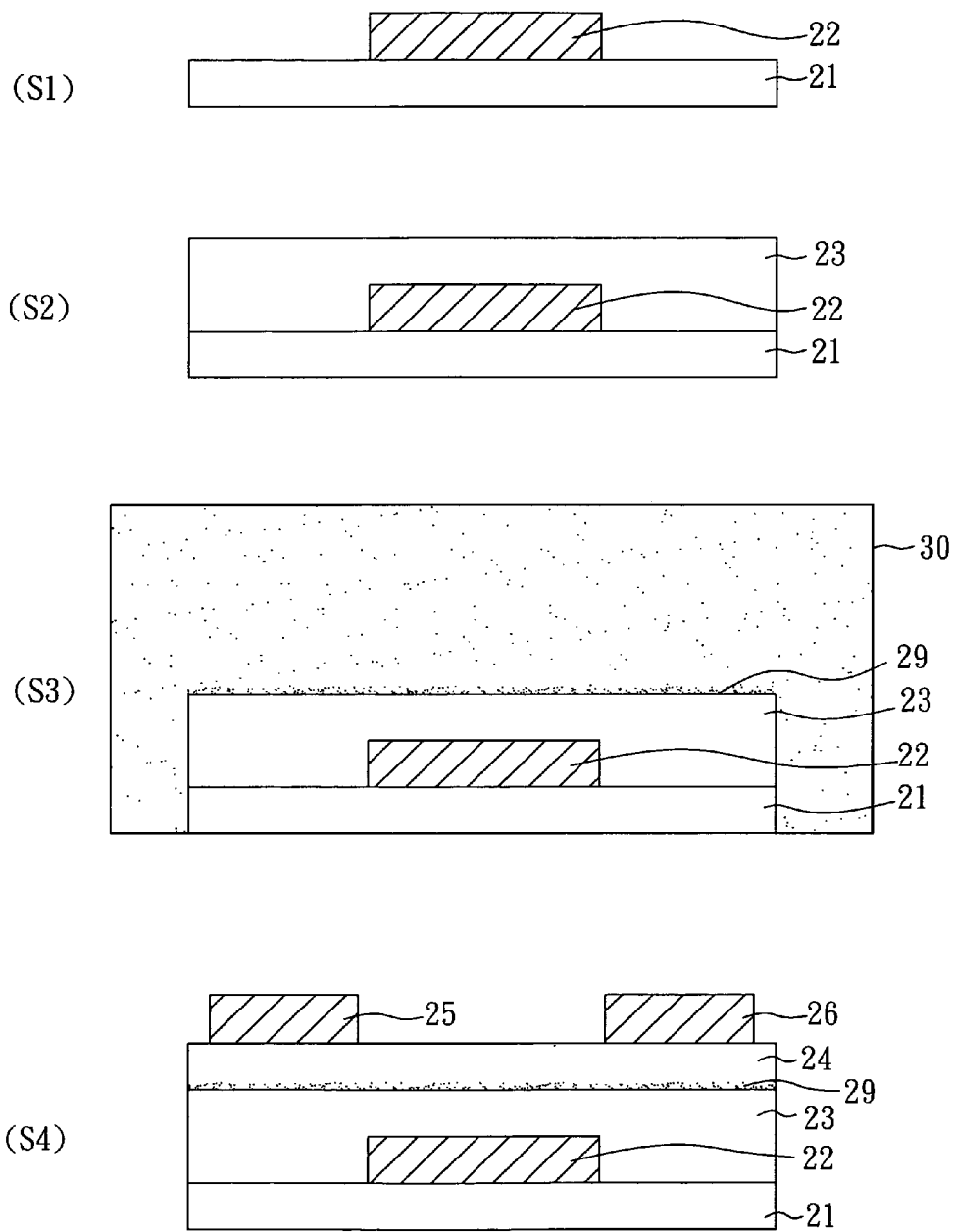
FIG. 3 is a schematic view of a process flow chart of fabricating the OTFT in a preferred example of the present invention.

With reference to FIG. 3, a transparent flexible PET (poly (ethylene terephthalate)) plastic film serving as the substrate 21 is ultrasonically cleaned with de-ionized (DI) water. Then the cleaned substrate 21 is processed through thermal evaporation with a patterned mask (not shown) to form a patterned copper layer that serves as the gate electrode 22 on the substrate 21 (S1). The conditions used during the thermal evaporation are listed below.

Pressure: $5 \times 10^{-6}$ torr;
Evaporating rate: 0.5 to 1 Å/s;
Thickness of the film: 50 to 100 nm.

Then, at 150° C. in an atmosphere with nitrogen and argon, using an aluminum target as the sputtering source, deposit an aluminum nitride (AlN) having high dielectric constant as the gate insulating layer 23 by a radio frequency sputtering method on the gate electrode 22 and the substrate 21 (S2).

After AlN film deposition, the as-deposited substrate is exposed to the methane ($CH_4$) gas in a vacuum chamber 30 at a base pressure of $3.5 \times 10^{-2}$ torr. The exposure of AlN to methane was operated at a total pressure of $7 \times 10^{-1}$ torr and at a flow rate of 100 sccm for 15 minutes to perform the surface treatment of the gate insulating layer 23 for forming hydrophobic molecules 29 on the surface of the gate insulating layer 23 (S3), and the substrate is heated to 150° C. during methane ($CH_4$) exposure.

After surface treatment of the gate insulating layer 23, pentacene obtained commercially is used as a raw material to form an organic semiconductor layer 24 covering the gate insulating layer 23 with hydrophobic molecules 29 thereon. Through a shadow metal mask, pentacene is deposited on the gate insulating layer 23 by thermal evaporation. The detailed conditions used during the deposition of the pentacene are listed below.

Pressure: $3 \times 10^{-6}$ ton;
Evaporating rate: 0.3 Å/s;
Thickness of the pentacene film: 100 nm.

Finally, by using a thermal evaporation method, a patterned gold (Au) layer is deposited through a shadow metal mask to define a source electrode 25 and a drain electrode 26 on the organic semiconductor layer 24, and therefore the OTFT of the present example is obtained.

Example 2

Except that acetylene ($C_2H_2$) is used instead of methane for the surface treatment of the gate insulating layer 23 in the step (S3), use the same methods and conditions of example 1 to fabricate an OTFT of the present example.

Example 3

Except that tetrafluoromethane ($CF_4$) is used instead of methane for the surface treatment of the gate insulating layer 23 in the step (S3), use the same methods and conditions of example 1 to fabricate an OTFT of the present example.

Testing Example 1

Figure 4:
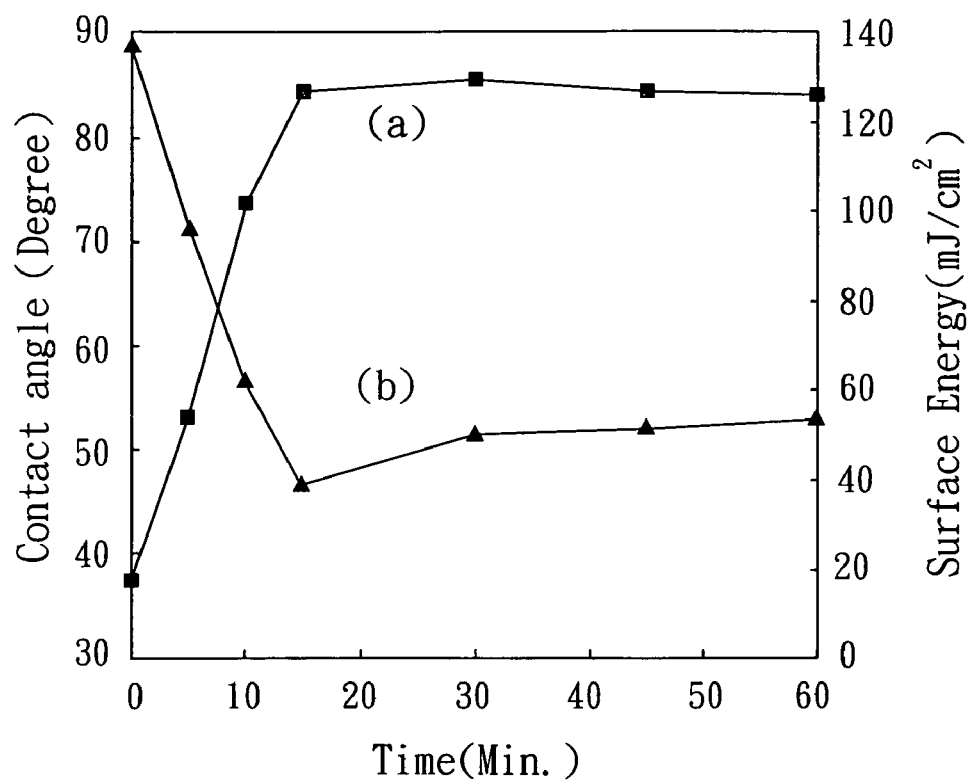
FIG. 4 is a testing result showing the water contact angle and the surface energy of testing example 1.

A substrate deposited with aluminum nitride (AlN) as the gate insulating layer is taken into water contact angle and surface energy test at different methane exposure (surface treatment) times, and the results are shown in FIG. 4. Surface energies were calculated using Fowkes and Young's approximation.

The water contact angles are approximately 37.5° on the AlN surface without methane exposure (surface treatment) and 84.5° on the AlN surface exposed to methane for 15 min (as shown in FIG. 4, curve (a)). Also, after exposing methane for 15 min, the surface energy reduces quickly to the lowest value within 15 min and remains approximately at the lowest value for a longer time (as shown in FIG. 4, curve (b)).

Testing Example 2

A top contact OTFT produced from the example 1 and a traditional OTFT without surface treatment of the gate insulating layer are taken for current-voltage testing. The mobility, threshold voltage, subthreshold swing (S.S.), and field-effect on/off current ratio ($I_{ON/OFF}$) are determined and listed in table 1 below.

TABLE 1

|  | OTFT produced from the example1 | traditional OTFT without surface treatment |
|---|---|---|
| Mobility ($cm^2$/vs) | ~0.924 | ~0.046 |
| threshold voltage (V) | ~-1.9 | ~-4.5 |
| field-effect on/off current ratio ($I_{ON/OFF}$) | ~$3.96 \times 10^4$ | ~$8.61 \times 10^3$ |
| subthreshold swing (S.S.) (V/decade) | ~0.46 | ~$4 \times 10^3$ |

As shown in table 1, the OTFT fabricated from the method of the present invention comprising surface treatment exhibits a high value of mobility (about 0.924 $cm^2$/Vs) and a better field-effect on/off current ratio ($I_{ON/OFF}$) comparing with the traditional OTFT made without surface treatment. Therefore, it is proved that the method of surface treatment for a gate insulating layer of an OTFT of the present invention is beneficial for the improvement of the electrical properties of the OTFT.

According to the method of fabricating an OTFT and the method of surface treatment for a gate insulating layer of an OTFT of the present invention, a gas having carbon (e.g. un-substituted hydrocarbon gases such as methane, acetylene, or propyne) or a gas having fluorine (e.g. halogen-substituted hydrocarbon gases such as tetrafluoromethane) is provided for surface treatment of the gate insulating layer under a low temperature condition, in which hydrophobic molecules are formed on the surface of the gate insulating layer, therefore the hydrophobicity of the surface of the gate insulating layer can be increased, the surface energy can be decreased which is constructive for the deposition of the organic semiconductor layer forming on the gate insulating layer, and the electrical properties of the OTFT can be improved.

Also, as can be seen from the mobility and field-effect on/off current ratio ($I_{ON/OFF}$) values determined from the current-voltage testing results, it is proved that the method of surface treatment for a gate insulating layer of an OTFT of the present invention is beneficial for the improvement of the electrical properties of the OTFT.

Compared with the conventional method such as a self-assembled monolayer (SAM) method or a plasma method, the method of the present invention has advantages of simple processing steps without destroying the surface and decreasing the capacity of the gate insulating layer. Besides, since the method of surface treatment for a gate insulating layer of an organic thin film transistor of the present invention can be operated in a low temperature condition, a plastic flexible substrate can be used without any special limitation, which means the method of the present invention can be applied to the fabrication of flexible OTFTs. Hence, the method of surface treatment for a gate insulating layer of an OTFT of the present invention is much more applicable compared with that such as plasma method in the prior art. Moreover, according to the method of surface treatment for a gate insulating layer of an OTFT of the present invention, expensive equipment such as plasma machines is not needed and therefore the manufacturing cost is favorably reduced and the economical efficiency is increased.

Although the present invention has been explained in relation to its preferred embodiment, it is to be understood that many other possible modifications and variations can be made without departing from the scope of the invention as hereinafter claimed.

What is claimed is:

1. A method of fabricating an organic thin film transistor, which comprises steps of:
   (S1) forming a gate electrode on a substrate;
   (S2) forming a gate insulating layer on the gate electrode;
   (S3) providing a gas on the surface of the gate insulating layer to form hydrophobic molecules on the surface of the gate insulating layer; and
   (S4) forming an organic semiconductor layer, a source electrode, and a drain electrode over the gate insulating layer having hydrophobic molecules thereon,
   wherein the gas of step (S3) is methane, ethane, acetylene, or tetrafluoromethane.

2. The method of fabricating an organic thin film transistor as claimed in claim 1, wherein a flow rate of the gas in the step (S3) is 10 to 1000 sccm.

3. The method of fabricating an organic thin film transistor as claimed in claim 1, wherein a pressure of the gas in the step (S3) is $1 \times 10^{-2}$ to 1 torr.

4. The method of fabricating an organic thin film transistor as claimed in claim 1, wherein in the step (S4), the organic semiconductor layer covers the whole gate insulating layer having hydrophobic molecules thereon, and the source electrode and the drain electrode are formed on the organic semiconductor layer to achieve a top contact OTFT.

5. The method of fabricating an organic thin film transistor as claimed in claim 1, wherein in the step (S4), the source electrode and the drain electrode are formed on the gate insulating layer having hydrophobic molecules thereon, and the organic semiconductor layer is formed covering the source electrode, the drain electrode, and the gate insulating layer to achieve a bottom contact OTFT.

6. The method of fabricating an organic thin film transistor as claimed in claim 1, wherein the gate insulating layer is made of aluminum nitride (AlN).

7. The method of fabricating an organic thin film transistor as claimed in claim 1, wherein the gate electrode is made of at least one selected from the group consisting of: Cu, Cr, Mn, Fe, Co, Ni, Zn, Pd, Ag, Pt, Au, Al, and the alloy thereof.

8. The method of fabricating an organic thin film transistor as claimed in claim 1, wherein the source electrode is made of at least one selected from the group consisting of: Cu, Cr, Mn, Fe, Co, Ni, Zn, Pd, Ag, Pt, Au, Al, and the alloy thereof.

9. The method of fabricating an organic thin film transistor as claimed in claim 1, wherein the drain electrode is made of at least one selected from the group consisting of: Cu, Cr, Mn, Fe, Co, Ni, Zn, Pd, Ag, Pt, Au, Al, and the alloy thereof.

10. The method of fabricating an organic thin film transistor as claimed in claim 1, wherein the substrate is heated to 150° C. during gas exposure to form hydrophobic molecules on the surface on the gate insulating layer.

11. The method of fabricating an organic thin film transistor as claimed in claim 10, wherein the substrate is a flexible plastic substrate.

12. The method of fabricating an organic thin film transistor as claimed in claim 1, wherein the substrate is a flexible plastic substrate.

13. The method of fabricating an organic thin film transistor as claimed in claim 12, wherein the plastic substrate is poly(ethylene)terephthalate.

14. The method of fabricating an organic thin film transistor as claimed in claim 1, wherein a flow rate of the gas in the step (S3) is 10 to 1000 sccm, a pressure of the gas in the step (S3) is $1 \times 10^{-2}$ to 1 torr, the gate insulating layer is made of aluminum nitride (AlN), and the substrate is a flexible plastic substrate.

15. A method of surface treatment for a gate insulating layer of an organic thin film transistor, which comprises:
   providing a gas on a surface of a gate insulating layer of an organic thin film transistor to form hydrophobic molecules on the surface of the gate insulating layer,
   wherein the gas is methane, ethane, acetylene, or tetrafluoromethane.

16. The method of surface treatment for a gate insulating layer of an organic thin film transistor as claimed in claim 15, wherein a flow rate of the gas is 10 to 1000 sccm.

17. The method of surface treatment for a gate insulating layer of an organic thin film transistor as claimed in claim 13, wherein a pressure of the gas is $1 \times 10^{-2}$ to 1 torr.

18. The method of surface treatment for a gate insulating layer of an organic thin film transistor as claimed in claim 15, wherein the gate insulating layer is made of aluminum nitride (AlN).

19. The method of surface treatment for a gate insulating layer of an organic thin film transistor as claimed in claim 15, wherein a flow rate of the gas is 10 to 1000 sccm, a pressure of the gas is $1 \times 10^{-2}$ to 1 torr, the gate insulating layer is made of aluminum nitride (AlN), and the gate insulating layer is heated to 150° C. during gas exposure to form hydrophobic molecules on the surface on the gate insulating layer.

* * * * *